(12) United States Patent
Shin et al.

(10) Patent No.: US 7,666,738 B2
(45) Date of Patent: Feb. 23, 2010

(54) METHOD FOR FABRICATING CAPACITOR OF SEMICONDUCTOR DEVICE

(75) Inventors: Dong-Woo Shin, Ichon-shi (KR);
Hyung-Bok Choi, Ichon-shi (KR);
Jong-Min Lee, Ichon-shi (KR);
Jin-Woong Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/952,767

(22) Filed: Dec. 7, 2007

(65) Prior Publication Data

US 2008/0076231 A1    Mar. 27, 2008

Related U.S. Application Data

(62) Division of application No. 10/749,775, filed on Dec. 30, 2003, now Pat. No. 7,407,854.

(30) Foreign Application Priority Data

Apr. 4, 2003   (KR) ................. 2003-21312

(51) Int. Cl.
*H01L 21/8242* (2006.01)
(52) U.S. Cl. ................. 438/255; 438/398; 257/E21.001
(58) Field of Classification Search ............ 438/255, 438/398
See application file for complete search history.

(56) References Cited

U.S. PATENT DOCUMENTS

| | | | |
|---|---|---|---|
| 6,180,451 B1 | 1/2001 | Hsieh et al. | |
| 6,218,260 B1 * | 4/2001 | Lee et al. | 438/398 |
| 6,235,613 B1 | 5/2001 | Nuttall | |
| 6,255,159 B1 | 7/2001 | Thakur | |
| 2001/0030336 A1 * | 10/2001 | Yamamoto | 257/296 |

FOREIGN PATENT DOCUMENTS

| | | |
|---|---|---|
| CN | 1384539 A | 12/2002 |
| KR | 2001-0008411 A | 2/2001 |
| KR | 2001-0091874 A | 10/2001 |

* cited by examiner

*Primary Examiner*—Jack Chen
(74) *Attorney, Agent, or Firm*—Townsend and Townsend and Crew LLP

(57) ABSTRACT

The present invention relates to a method for fabricating a capacitor of a semiconductor device. The method includes the steps of: forming a first amorphous silicon layer doped with an impurity in a predetermined first doping concentration suppressing dopants from locally agglomerating; forming an impurity undoped second amorphous silicon layer on the first amorphous silicon layer in an in-situ condition; forming a storage node by patterning the first amorphous silicon layer and the second amorphous silicon layer; forming silicon grains on a surface of the storage node; and doping the impurity to the storage node and the silicon grains until reaching a second predetermined concentration for providing conductivity required by the storage node.

6 Claims, 10 Drawing Sheets

MPS GROWTH SUPPRESSION REGION

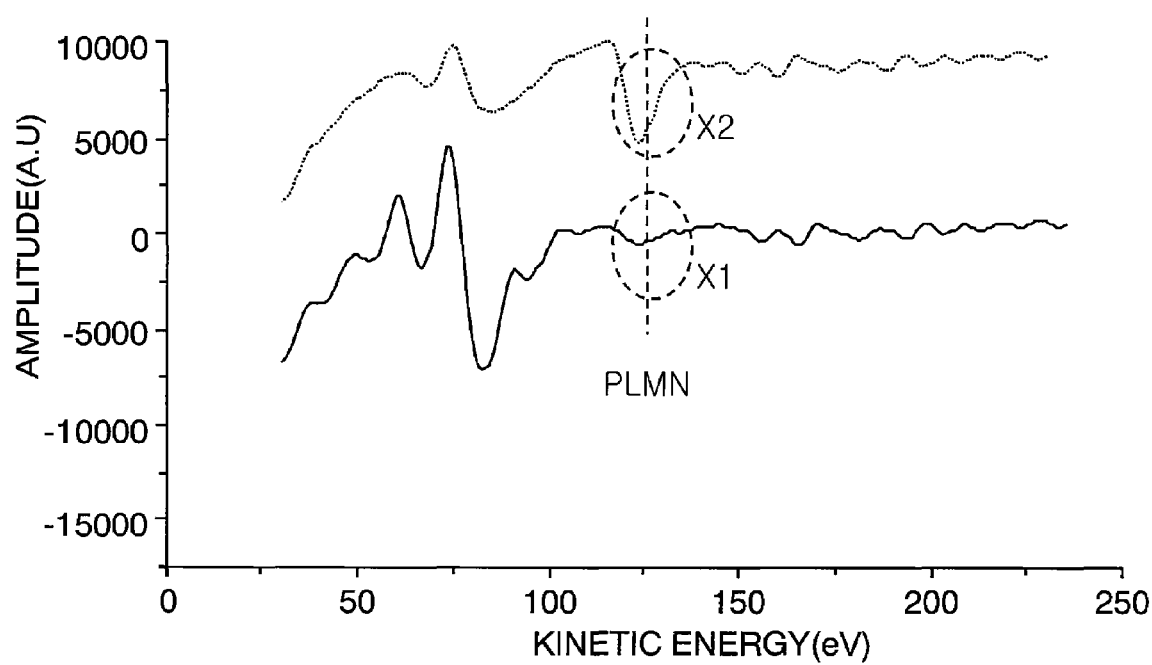

72 POINTS

106 POINTS

42 POINTS

71 POINTS

13 POINTS

METHOD FOR FABRICATING CAPACITOR OF SEMICONDUCTOR DEVICE

FIELD OF THE INVENTION

The present invention relates to a method for fabricating a semiconductor device; and, more particularly, to a method for fabricating a capacitor of a semiconductor device.

DESCRIPTION OF RELATED ARTS

Highly progressed integration and a rapid decrease in a minimum line-width of a semiconductor device have been led an area of a capacitor to be decreased. Even though the area of the capacitor decreases, the capacitor should have a secured capacitance of above about 25 fF, which is the minimum capacitance required for each cell. Several methods of meeting the above need have been contrived to form a capacitor with a high capacitance within a limited area. One suggested method is to form a dielectric layer with a material having a high dielectric constant such as $Ta_2O_5$, $Al_2O_3$ and $HfO_2$ instead of silicon oxide of which dielectric constant ($\in$) is about 3.8 and nitride of which dielectric constant ($\in$) is about 7. Another method is to form a capacitor in cylinder type and concave type. Another alternative method is to increase an effective surface area of a storage node by a factor of about 1.7 to about 2 by forming a metastable-polysilicon (MPS) layer on a surface of the storage node.

Recently, the method of increasing the effective surface area of the storage node by forming the MPS layer on the surface area of the storage node has been a focus of the study for achieving the effect on securing the sufficient capacitance of the capacitor. For a method of forming a MPS capacitor, a storage node made of an amorphous silicon layer is first formed. Then, silane ($SiH_4$)-based gas is injected as a seed gas, and silicon atoms migrate towards the seed layer, i.e., the amorphous silicon layer, in a vacuum state to form a MPS layer. At this time, a migration speed and amounts of the silicon atoms vary depending on an injection period of the seed gas, a migration period of the silicon atoms, a flow quantity, a temperature, a pressure and a doping concentration of impurities, and thus, the size and amounts of the growing MPS layer are consequently varied.

Currently, an inner capacitor structure combined with the MPS layer growth technique is employed. That is, this MPS layer growth technique is applied only to inner walls of the capacitor under a condition of allowing each cell to be isolated.

FIG. 1 is a cross-sectional view of a conventional MPS capacitor structure. Referring to FIG. 1, the conventional MPS capacitor is electrically connected to an impurity region of a substrate by a contact plug 11 passing through an insulation layer 10. Herein, a plurality of the contact plugs 11 is formed. Also, the MPS capacitor structure includes a storage node 12 on which MPS grains 12A are disposed, a dielectric layer 13 and a plate 14. The storage node 12 is supported by stacked layers of an etch barrier layer 15 and a storage node oxide layer 16.

In FIG. 1, the storage node 12 on which the MPS grains 12A are disposed is formed by a series of processes. First, an impurity doped amorphous silicon layer and an impurity undoped amorphous silicon layer are deposited in an in-situ condition. Herein, the doped amorphous silicon layer is formed by doping phosphorus (P) with a high concentration of above about $24 \times 10^{20}/cm^3$. Then, a chemical mechanical polishing (CMP) process or an etch-back process is performed to make a double layer of the impurity doped amorphous silicon layer and the impurity undoped amorphous silicon layer have a cylinder shape. Afterwards, the impurity undoped amorphous silicon layer is grown to the MPS grains 12A through a MPS process so that the MPS grains 12A are grown on a surface of the impurity doped amorphous silicon layer. At this time, the amorphous silicon layers become polycrystalline layers. Eventually, the MPS capacitor has a structure wherein the MPS grains 12A are grown only on inner walls of the cylindrical storage node.

As the design rule of a semiconductor device has been decreased, uniformity in size of the MPS grains has been currently considered very important to secure sufficient capacitance for the same capacitor structure. However, in the conventional method of depositing the amorphous silicon layer for use in a storage node through a chemical vapor deposition CVD, phosphorus (P) is locally concentrated to a certain region in a wafer. Thus, even after the deposition of the impurity undoped amorphous silicon layer, the phosphorus doping concentration becomes imbalanced by being concentrated highly at a particular region compared to other regions. This imbalanced doping concentration becomes pronounced as the applicable design rule reduces due to a decreased thickness of the storage node. In more detail, because of the decreased thickness of the storage node, the growth of the MPS grains are hindered as the phosphorus doped onto the impurity doped amorphous silicon layer of the storage node affects the impurity undoped amorphous silicon layer.

The phosphorus (P) locally concentrated on a surface of the silicon layer for use in the storage node (hereinafter referred to as the storage node silicon layer) either forms a new reaction generating layer on the surface of the storage node silicon layer during a cleaning process prior to the MPS process or hinders migrations of silicon atoms, resulting in suppression of the MPS grains 12A growth.

FIG. 2A is a micrograph showing a region suppressed with the MPS grain growth based on the above described conventional method. FIG. 2B shows a scanning result of auger electron spectroscopy (AES) based on the conventional method.

As shown, a region where the MPS grain growth is locally hindered is formed in a capacitor under the design rule of below about 0.15 µm (refer to FIG. 2A), and it is observed from the AES that a concentration of phosphorus is higher at the region $X_2$, where the MPS grain growth is suppressed, than at a region $X_1$, where the MPS grain is normally grown (refer to the dotted line $P_{LMN}$ in FIG. 2B).

As described above, if the MPS grain growth is suppressed in a certain region of the storage node, the capacitance of this region abruptly decreases. As a result, a problem of inducing a bit failure during operations of a device may arise.

SUMMARY OF THE INVENTION

It is, therefore, an object of the present invention to provide a method for fabricating a capacitor of a semiconductor device capable of solving a problem of suppressing growth of metastable-polysilicon (MPS) grains caused by an impurity locally concentrated on a surface of a storage node.

In accordance with an aspect of the present invention, there is provided a method for forming a storage node of a capacitor, including the steps of: forming a first amorphous silicon layer doped with an impurity in a predetermined first doping concentration suppressing dopants from locally agglomerating; forming an impurity undoped second amorphous silicon layer on the first amorphous silicon layer in an in-situ condition; forming a storage node by patterning the first amorphous silicon layer and the second amorphous silicon layer; forming silicon grains on a surface of the storage node; and doping the impurity to the storage node and the silicon grains until reaching a second predetermined concentration for providing conductivity required by the storage node.

In accordance with another aspect of the present invention, there is also provided a method for fabricating a capacitor of a semiconductor device, including the steps of: forming an insulation layer having contact holes on an upper surface of a substrate; forming a plurality of plugs connected to the substrate by being filled into the contact holes; forming an isolation layer having holes exposing the plurality of the plugs on the insulation layer; forming a first amorphous silicon layer doped with an impurity in a predetermined first doping concentration suppressing dopants from locally agglomerating; forming an impurity undoped second amorphous silicon layer on the first amorphous silicon layer in an in-situ condition; forming a storage node by patterning the first amorphous silicon layer and the second amorphous silicon layer; forming silicon grains on a surface of the storage node; and doping the impurity to the storage node and the silicon grains until reaching a second predetermined concentration for providing conductivity required by the storage node.

BRIEF DESCRIPTION OF THE DRAWING(S)

The above and other objects and features of the present invention will become apparent from the following description of the preferred embodiments given in conjunction with the accompanying drawings, in which:

FIG. 2B shows a scanning result of auger electron spectroscopy (AES) based on the conventional method for forming the MPS capacitor structure;

DETAILED DESCRIPTION OF THE INVENTION

Hereinafter, detailed descriptions on a method for fabricating a capacitor of a semiconductor device capable of preventing a phenomenon of silicon grain growth suppression will be provided with reference to the accompanying drawings.

FIGS. 3A to 3E are cross-sectional views of a capacitor fabricated in accordance with a preferred embodiment of the present invention.

Figure 1:
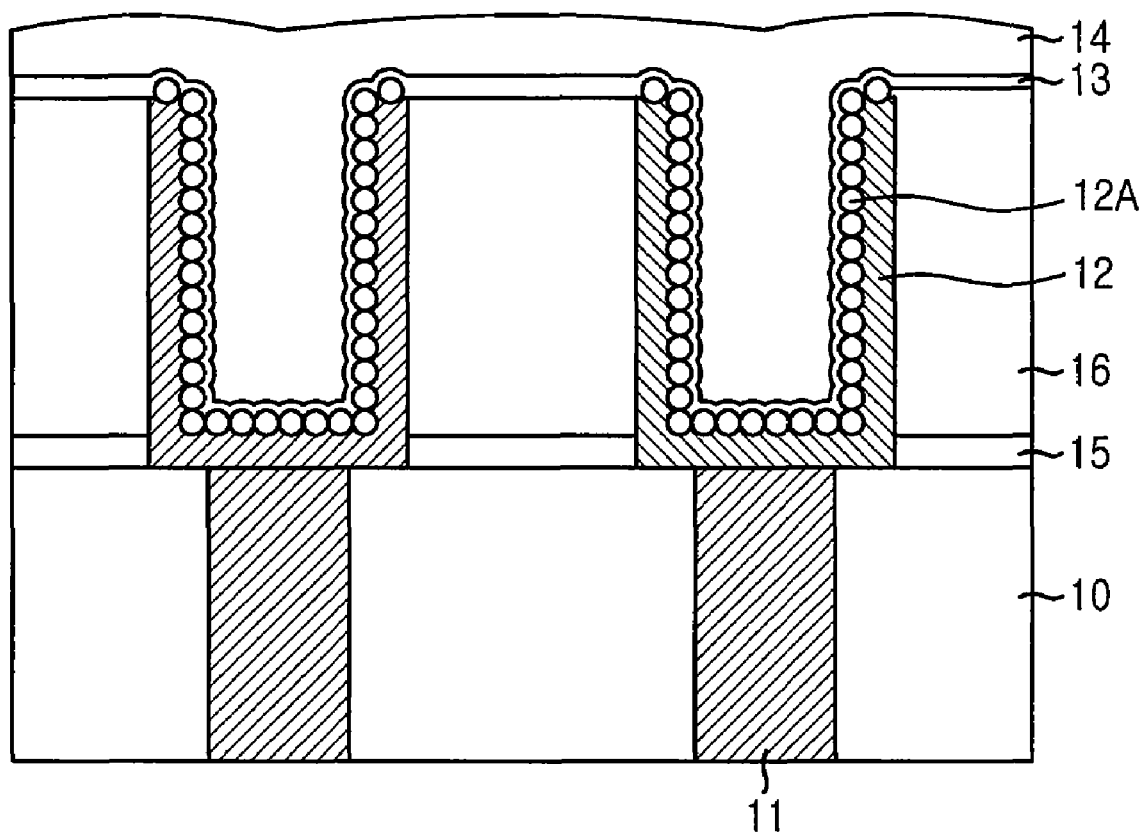
FIG. 1 is a cross-sectional view showing a conventional metastable-polysilicon (MPS) capacitor structure.
Figure 2A:
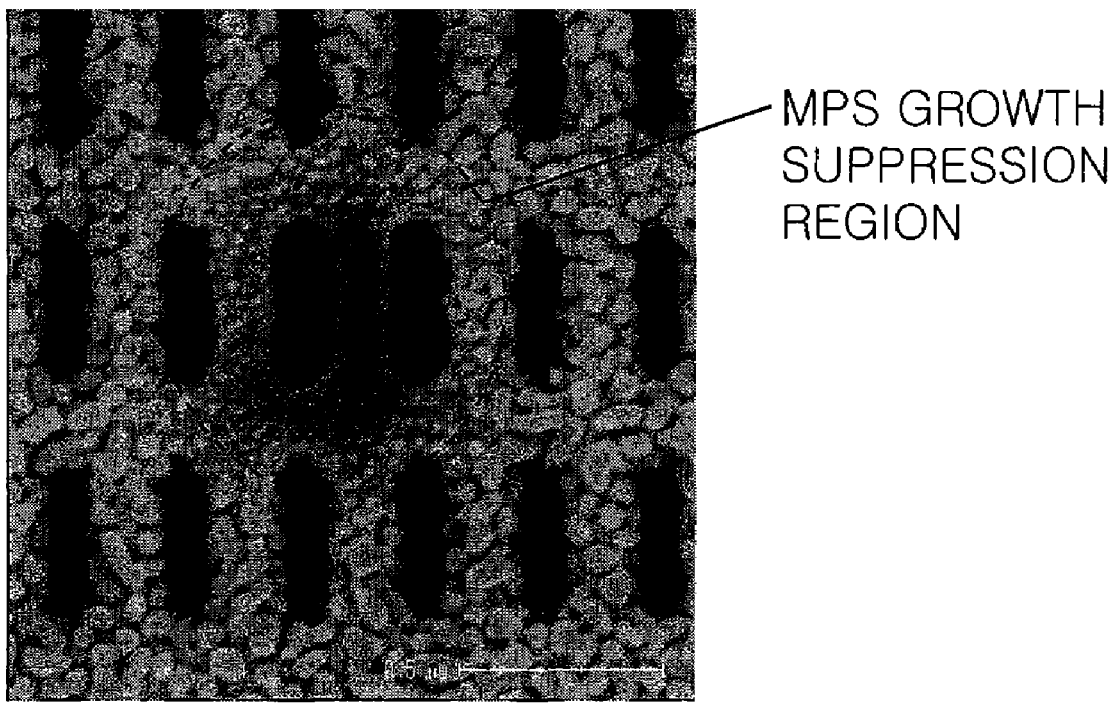
FIG. 2A is a micrograph of a region where MPS grains are suppressed from being grown based on a conventional method for forming the MPS capacitor structure.
Figure 3A:
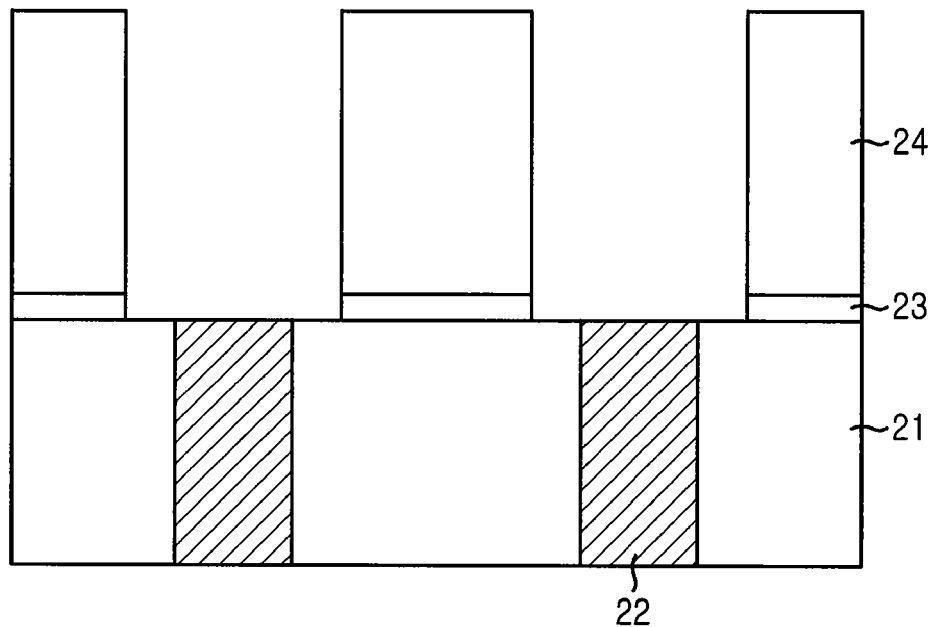
FIGS. 3A to 3E are cross-sectional views of a capacitor fabricated in accordance with a preferred embodiment of the present invention.

Referring to FIG. 3A, an inter-layer insulation layer 21 is formed on a substrate (not shown) in which a bottom structure providing a transistor is formed. Then, a plurality of contact holes for connecting electrically an impurity region of the substrate with a storage node is formed, and a conductive material is deposited into each contact hole. After the deposition of the conductive material, a chemical mechanical polishing (CMP) process or an etch-back process is performed to the deposited conductive material to form a plurality of contact plugs 22. An etch barrier layer 23 is then formed on an entire surface of the above resultant structure. Such material as plasma enhanced tetra-ethyl-ortho silicate (PE-TEOS), boron-phosphorus-silicate glass (BPSG), phosphorus-silicate glass (PSG) and undoped silicate glass (USG) is deposited on the etch barrier layer 23 so that a storage node oxide layer is formed. At this time, the storage node oxide layer is deposited to a thickness in a range from about 15000 Å to about 25000 Å.

Next, an isolating pattern 24 isolating each storage node (hereinafter referred to as the storage node isolating pattern) is formed by sequentially etching the storage node oxide layer and the etch barrier layer 23 and then exposing the contact plugs 22 formed in a region designated for a storage node (hereinafter referred to as the storage node region). At this time, the etch barrier layer 23 is a layer for stopping an etching of the oxide layer during the formation of the storage node isolating pattern 24. For this effect, the etch barrier layer 23 is made of a material having a good etch selectivity with respect to the storage node isolating pattern 24. Silicon nitride is an example of such material. This etch barrier layer 23 with its high height also provides lateral supports to the storage node. As a result of this lateral support, it is possible to provide the storage node with excellent mechanical strength.

Meanwhile, it is possible to change the stacking order of the etch barrier layer 23. That is, the inter-layer insulation layer 21 and the etch barrier layer 23 are first deposited, and then, the contact holes and the contact plugs 22 are formed. Thereafter, the storage node oxide layer for forming the storage node isolating pattern 24 can be deposited on the above constructed structure.

Figure 3B:
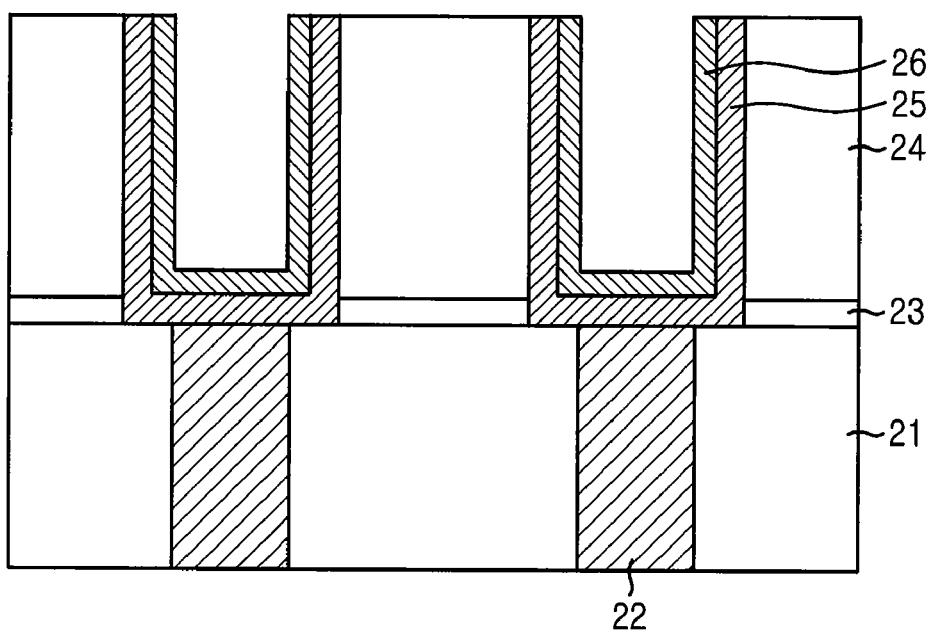

Referring to FIG. 3B, a first amorphous silicon layer 25 and a second amorphous silicon layer 26 are consecutively formed on an entire surface of the resultant structure including the storage node isolating pattern 24 in an in-situ condition. At this time, the first amorphous silicon layer 25 doped with an impurity having a concentration lower than about $24 \times 10^{20}/cm^3$. Meanwhile, the second amorphous silicon layer 26 is not doped with the impurity. Hereinafter, the MPS grain is referred to as the silicon grain.

The first impurity doped amorphous silicon layer 25 and the second impurity undoped amorphous silicon layer 26 are formed in an in-situ condition to make use of the facts that the silicon grain is not grown in the first amorphous silicon layer 25 doped with a high concentration of the impurity because silicon atoms do hardly migrate and the silicon grain is easily grown in the second impurity undoped amorphous silicon layer 26 because silicon atoms rapidly migrate. That is, the first impurity doped amorphous silicon layer 25 becomes an outer wall for structuring the storage node in cylinder shape, while the second impurity undoped silicon layer 26 becomes the silicon grain formed on an inner wall of the cylindrical storage node. Therefore, the first amorphous silicon layer 25 is doped with a high concentration of the impurity so that the first amorphous silicon layer 25 becomes a bone structure of the storage node by stopping the migration of the silicon atoms from the second impurity undoped amorphous silicon layer even if the silicon atoms of the second amorphous silicon layer 26 are grown to the silicon grains by their migration.

For the in-situ deposition of the first amorphous silicon layer 25 and the second amorphous silicon layer 26, phosphorus (P) can be used as the impurity doped onto the first amorphous silicon layer 25. It is possible to dope phosphorus simultaneous to the deposition of the first amorphous silicon layer 25. At this time, a doping concentration of the phosphorus can be controlled by controlling a flow quantity of a source gas of the impurity containing phosphorus with respect to that of a silicon source gas. For the silicon source gas, such silane based gas as monosilane ($SiH_4$), disilane ($Si_2H_6$), trisilane ($Si_3H_8$) and dichlorosilane ($SiH_2Cl_2$) can be used. The source gas of the impurity containing phosphorus can be phosphine ($PH_3$) gas. The doping concentration of the phosphorus of the first amorphous silicon layer 25 is determined by a migration period of the silicon atoms and the size of the silicon grain to be grown. With use of secondary ion mass spectrometry (SIMS), the doping concentration of the phosphorus is set to be low ranging from about $1 \times 10^{19}/cm^3$ to about $2 \times 10^{20}/cm^3$. This phosphorus doping concentration is lower than the typically doped phosphorus concentration, which is above about $24 \times 10^{20}/cm^3$.

As mentioned above, this low phosphorus doping concentration is to solve the problem of suppressing the silicon grain growth locally. That is, if the doping concentration of the phosphorus is lower than the doping concentration of about $1.0 \times 10^{19}/cm^3$ to about $2.0 \times 10^{20}/cm^3$, it is possible to prevent the suppression of the local silicon grain growth. The reason for this effect is because this lowered doping concentration suppresses dopants from locally agglomerating during the deposition of the first amorphous silicon layer 25. However, this low doping concentration results in a problem that a contact resistance between the contact plug 22 and the storage node increases or an overall capacitance decreases due to a storage node depletion phenomenon caused by the low doping concentration. Therefore, a subsequent doping step proceeds to complement short of the doping concentration by employing a higher doing concentration than the conventionally used doping concentration. Detailed descriptions about the subsequent doping step will be provided in a later section.

The thickness of the first amorphous silicon layer 25 and that of the second amorphous silicon layer 26 are determined by an integration level of a desired device, height and width of the storage node. In this preferred embodiment, the thickness of each amorphous silicon layer ranges from about 100 Å to about 300 Å. Also, a deposition temperature of the first amorphous silicon layer 25 and the second amorphous silicon layer 26 is maintained to be in a range from about 500° C. to about 550° C. The reason for maintaining the deposition temperature is because an amorphous silicon layer changes its state to a polycrystalline state if the deposition temperature is above about 550° C. The silicon grain cannot be grown from the polycrystalline silicon layer.

Subsequently, a chemical mechanical polishing (CMP) process or an etch-back process is performed to remove portions of the first amorphous silicon layer 25 and the second amorphous silicon layer 26 formed on an upper surface of each storage node isolating pattern 24, whereby the cylindrical storage node having a double layer of the first amorphous silicon layer 25 and the second amorphous silicon layer 26 is formed. Herein, under the consideration that impurities like a polishing agent or etched particles may remain inside of the cylindrical storage node while the portions of the first amorphous silicon layer 25 and the second amorphous silicon layer 26 are removed, a material having a good step coverage property, e.g., a photoresist, is filled into the inner side of the cylindrical storage node. Then, the CMP process or the etch-back process is performed until the storage node isolating patterns are exposed, and the photoresist is removed by an ashing process.

Figure 3C:
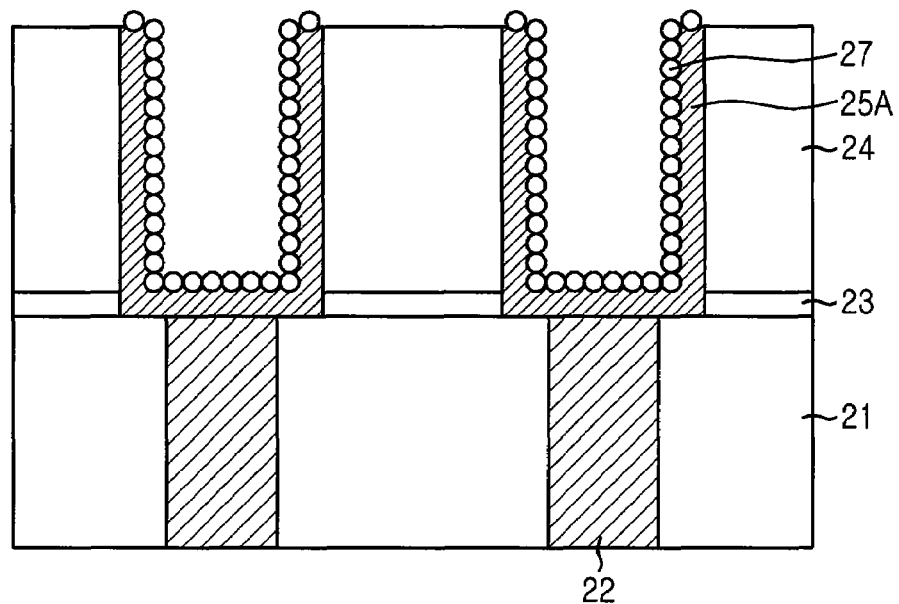

Referring to FIG. 3C, the silicon grains 27 are grown on the inner walls of the storage node. The silicon grains 27 can be grown by two methods. First one is to form a silicon seed on a surface of the second amorphous silicon layer 26 with use of silane-based gas and make silicon atoms migrate by performing an annealing process at a temperature ranging from about 600° C. to about 650° C. That is, the second amorphous silicon layer 26 undoped with the impurity is grown to the silicon grains 27.

When the silicon grains 27 are grown by the first method, the silicon atoms of the first amorphous silicon layer 25 are suppressed from migrating. In contrary, the silicon atoms of the second amorphous silicon layer 26 are grown to the silicon grains 27 by the migration of the silicon atoms. In addition, the first amorphous silicon layer 25 and the silicon grains 27 become crystallized through the aforementioned annealing process. At this time, if most of the silicon atoms of the second amorphous silicon layer 26 migrate and are grown to be the silicon grains 27 in order to enlarge the size of the silicon grains 27, the first amorphous silicon layer 25 can be exposed in a space between the grown silicon grains 27. The reason for this result is because most of the silicon atoms of the first amorphous silicon layer 25 are consumed to be grown as the silicon grains 27. Even if this case happens, the migration of the silicon atoms is suppressed in the first amorphous silicon layer 25 with the high phosphorus doping concentration. Thus, it is possible to support the storage node at least as much as the thickness of the first amorphous silicon layer 25. Hereinafter, the first amorphous silicon layer 25 with the polycrystalline structure is referred to as a polycrystalline silicon layer 25A, and the polycrystalline silicon layer 25A and the silicon grains 27 are called the storage node.

During the above described silicon grain 27 growth, the phosphorus concentration doped onto the first amorphous silicon layer 25 is lowered so that the silicon grains 27 are grown on an entire surface of the polycrystalline silicon layer 25A. Therefore, it is possible to obtain uniformity of the silicon grain growth.

Figure 3D:
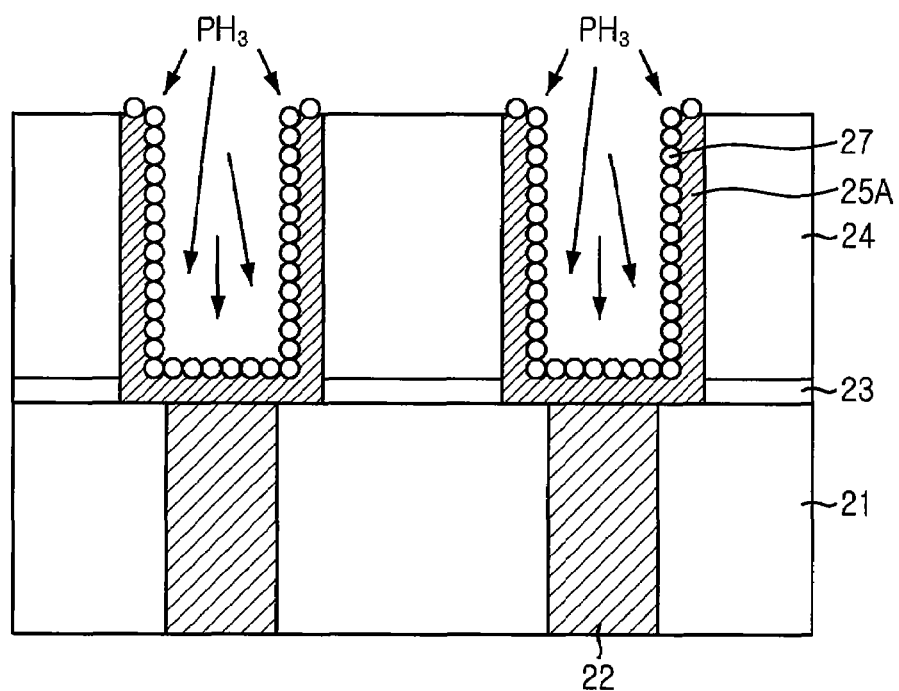

Referring to FIG. 3D, a $PH_3$ doping process proceeds to secure conductivity required by the storage node, e.g., a doping concentration of the phosphorus contained in the polycrystalline silicon layer 25A and the silicon grains 27. At this time, the $PH_3$ doping process is also for doping sufficiently the silicon grains 27 with the impurity, i.e., phosphorus, in addition to the purpose of securing the conductivity of the storage node by supplementing the phosphorus that is previously doped in a low concentration when the first amorphous silicon layer 25 is deposited. Herein, the PH$_3$ doping process proceeds under a reinforced recipe compared to a conventional PH3 doping process. That is, a process temperature, a process pressure, a flow quantity of a doping gas, a doping period and a plasma power are increased.

In more detail of the PH$_3$ doping process, a surface of the storage node including the grown silicon grains 27 is cleaned by using a chemical, e.g., hydrogen fluoride (HF) or buffered oxide etchant (BOE). Then, a PH$_3$ doping is performed to dope phosphorus onto a portion where the silicon grains 27 are grown. In addition, the phosphorus doping concentration inside of the previously formed storage node is increased. Thereafter, PH$_3$ gas gets diffused inside of the storage node through a diffusion process by using a reaction gas to increase the phosphorus doping concentration in all regions to about $24 \times 10^{20}/cm^3$. As a result of this increased phosphorus doping concentration, it is possible to secure a contact resistance between the storage node and the contact plugs as well as to secure conductivity of the storage node.

The PH$_3$ doping process for increasing the phosphorus doping concentration within the storage node proceeds by employing a chamber plasma doping method, a furnace doping method, a combined method of a chamber plasma doping and an annealing.

First, the chamber plasma doping is carried out at a temperature ranging from about 700° C. to about 800° C. and a pressure of about 1.5 torr to about 2.5 torr for about 2 minutes to about 5 minutes by supplying a plasma power of about 300 W to about 500 W. At this time, a flow quantity of the PH$_3$ gas ranges from about 300 sccm to about 500 sccm.

Second, the furnace doping is carried out at a temperature ranging from about 600° C. to about 750° C. and a pressure of about 5 torr to about 10 torr for about 1 hour to about 2 hours. At this time, a flow quantity of the PH$_3$ gas ranges from about 100 sccm to about 200 sccm.

Third, in case of using the combined method of the chamber plasma doping and the annealing, the chamber plasma doping proceeds first, and the annealing proceeds thereafter. For instance, the chamber plasma doping proceeds at a temperature ranging from about 700° C. to about 800° C. and a pressure of about 1.0 torr to about 2.5 torr for about 1 minute to about 5 minutes by flowing PH$_3$ gas in a quantity ranging from about 100 sccm to about 500 sccm. After the chamber plasma doping, the annealing proceeds at a temperature ranging from about 600° C. to about 750° C. and a pressure of about 5 torr to about 10 torr in an atmosphere of nitrogen (N$_2$) for about 1 hour to about 2 hours.

The above described three methods for the PH$_3$ doping process provide effects on securing a contact resistance between the storage node and the contact plug and simultaneously securing conductivity of the storage node. However, these methods show the following differences.

The first method is a method of physically doping phosphorous onto a surface of the storage node. The conventional method is capable of satisfying the level of the phosphorus doping concentration of the grown silicon grains 27. However, it is not sufficient to satisfy the level of the phosphorus doping concentration at a region to which each contact plug 22 is contacted. Therefore, the chamber plasma doping according to the present invention is a method of improving diffusions of phosphorus by reinforcing the PH$_3$ doping process recipe so as to secure the level of the phosphorus doping concentration at the surface of the storage node as well as the contact plugs. Process recipes for the conventional method and the chamber plasma doping are compared in Table 1 provided in a later part.

The furnace doping is a method of chemically doping phosphorus onto the surface of the storage node. The conventional method is capable of satisfying the level of the phosphorus doping concentration at a region to which each contact plug 22 is contacted. However, it is impossible to obtain a required surface concentration in case that the phosphorus gets excessively diffused. Therefore, even if the phosphorus existing in the surface gets diffused excessively, sufficient amounts of the phosphorus are continuously supplied to the surface of the storage node during the annealing process, which is employed for the furnace doping method. As a result of this continuous supply of the phosphorus, it is possible to prevent a decrease of the phosphorus concentration existing in the surface.

The third method of combining the chamber plasma doping and the annealing satisfies the level of the doping concentration at a region to which each contact plug 22 contacts and concurrently increases a surface concentration of the storage node. This combined method is a more preferable approach for securing conductivity of the storage node and a contact resistance between the storage node and the contact plug 22.

After the PH$_3$ doping process, the storage node isolating pattern 24 is subjected to a dip-out process by using a wet chemical such as HF or BOE. Thereafter, a dielectric layer 28 and a plate 29 are formed on the above resultant structure, whereby a capacitor is completely formed.

Figure 3E:
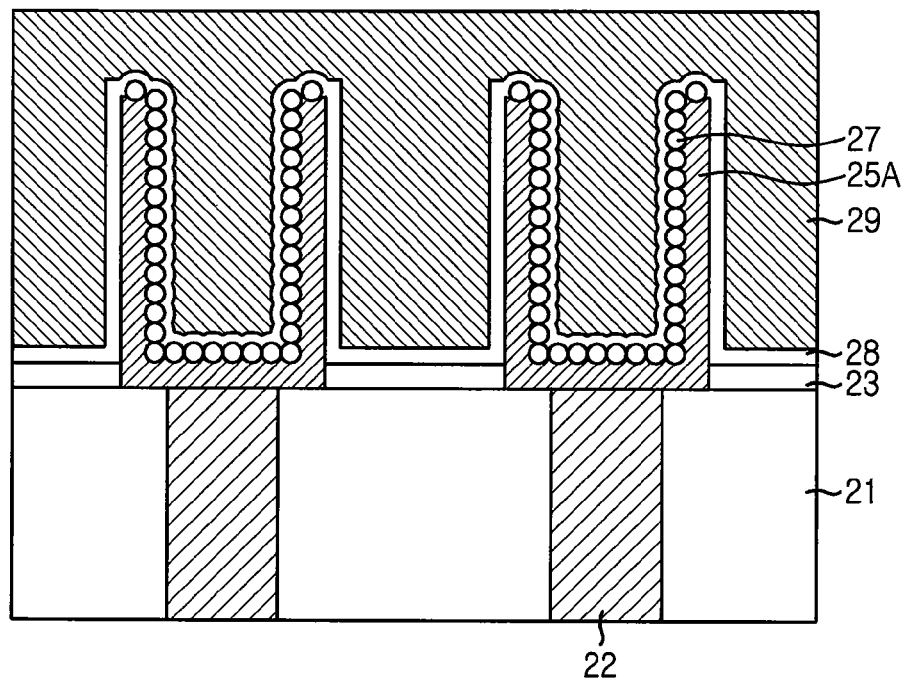

As shown in FIG. 3E, the silicon grains 27 are uniformly formed on the surface of the storage node of the capacitor. Also, phosphorus is additionally doped onto the storage node surface after the formation of the silicon grains 27, and thus, the level of conductivity required by the storage node is sufficiently secured.

Figure 4:
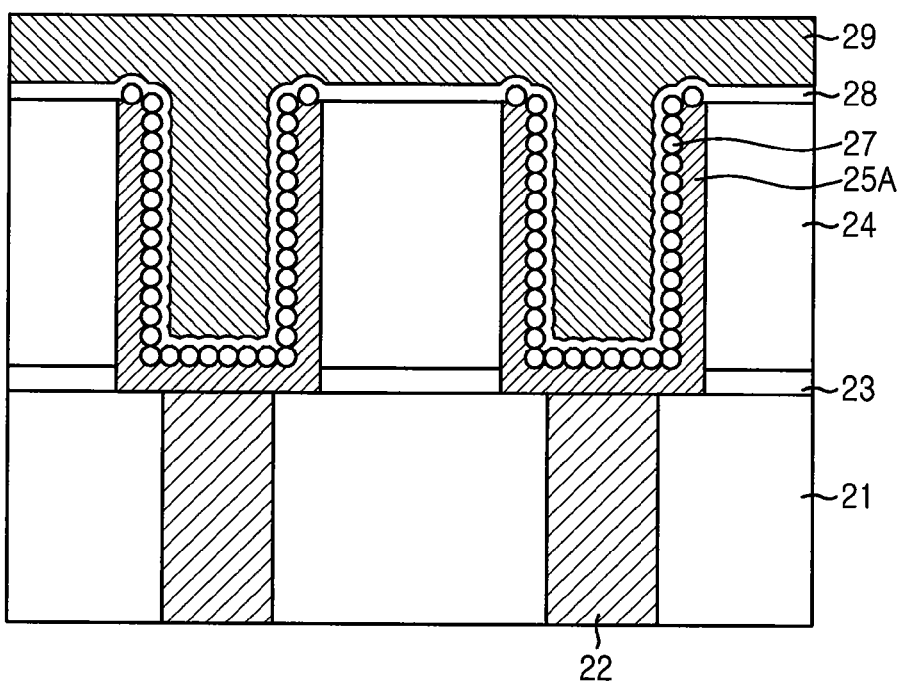
FIG. 4 is a cross-sectional view showing an example of a differentiated capacitor fabricated under the application of the preferred embodiment of the present invention.

FIG. 4 is a cross-sectional view showing an example of a differentiated capacitor fabricated by applying the preferred embodiment of the present invention. The capacitor has a concave structure, wherein the dielectric layer 28 and the plate 29 are formed without removing the storage node isolating pattern 24.

Figure 5A:
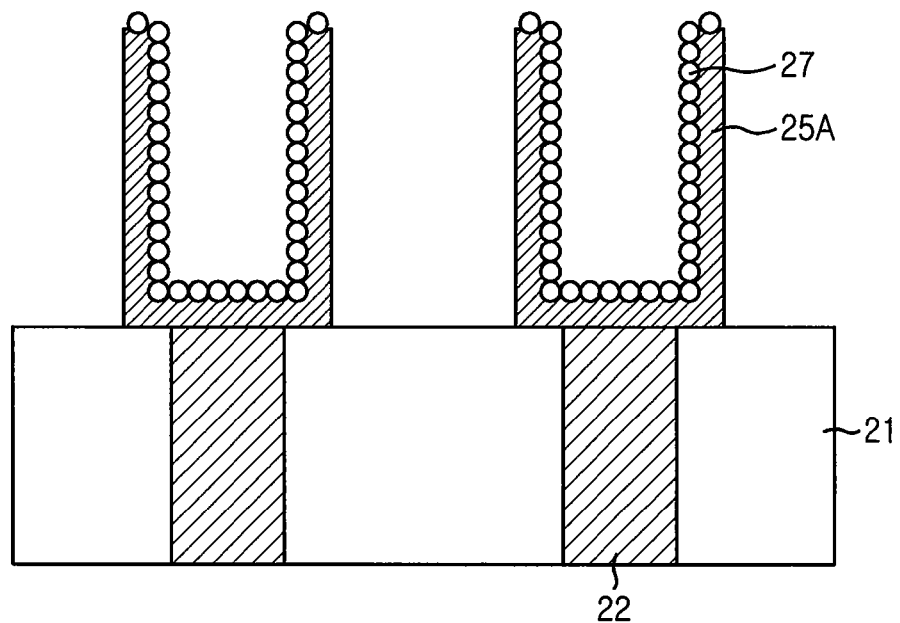
FIGS. 5A to 5C are cross-sectional views of a capacitor fabricated by performing an additional phosphine ($PH_3$) doping process in accordance with a second preferred embodiment of the present invention.
Figure 5B:
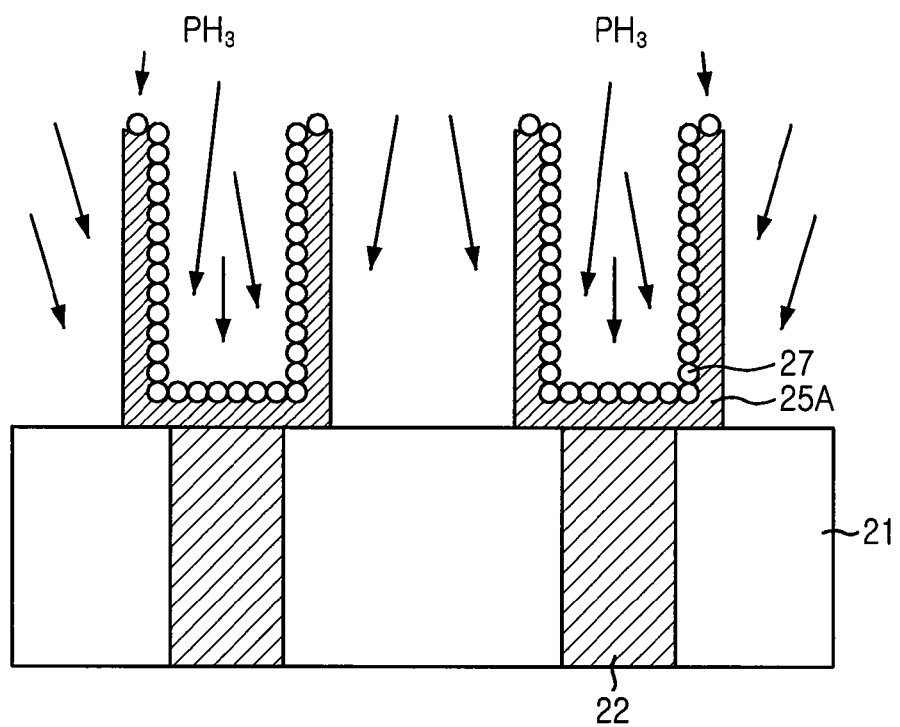
Figure 5C:
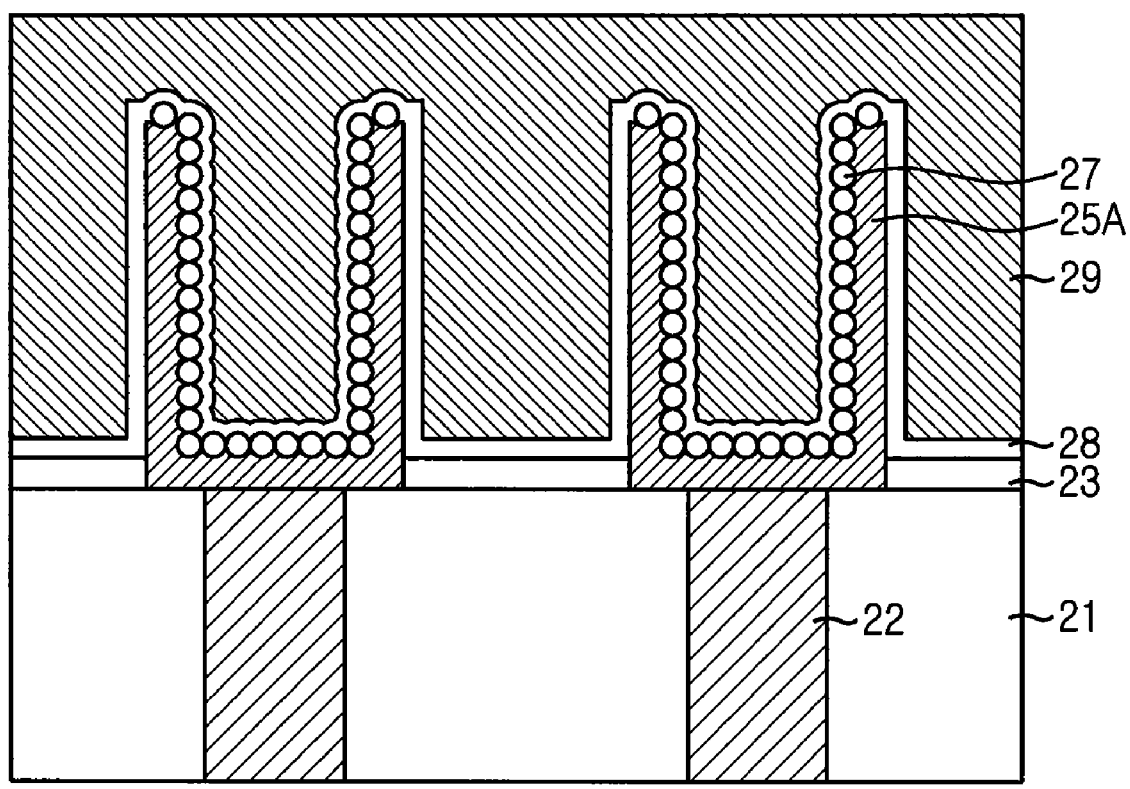

FIGS. 5A to 5C are cross-sectional views of a capacitor fabricated by performing an additional PH$_3$ doping process in accordance with a second preferred embodiment of the present invention. After the wet dip-out process for removing the storage node isolating pattern 24, the PH$_3$ doping process is additionally performed, and the dielectric layer 28 and the plate 29 are formed thereafter. This additional PH$_3$ doping process is to enhance effectiveness of the phosphorus doping within the storage node as well as to compensate a phosphorus doping profile. That is, a depletion phenomenon may occur due to an insufficient doping concentration of the phosphorus since the doped phosphorus come off from the surface of the storage node during the wet dip-out process for the removal of the storage node isolating pattern 24. Thus, the PH$_3$ doping process is additionally performed to additionally dope phosphorus onto the surface of the storage node.

More specifically, as shown in FIG. 5A, a first PH$_3$ doping process is performed after the silicon grain 27 growth. Then, the storage node isolating pattern 24 is removed through the wet dip-out process so that outer and inner walls of the storage node are exposed.

Referring to FIG. 5B, a second PH$_3$ doping process is performed. For instance, a chamber plasma doping proceeds at a temperature ranging from about 700° C. to about 800° C. and a pressure of about 1.5 torr to about 2.5 torr for about 2 minutes to about 5 minutes by supplying a plasma power ranging from about 300 W to about 500 W. At this time, PH$_3$ gas is flowed in a quantity of about 300 sccm to about 500 sccm. It is also possible to perform a furnace doping at a temperature ranging from about 600° C. to about 750° C. and a pressure of about 5 torr to about 10 torr with supplied PH$_3$ gas for about 1 hour to about 2 hours. At this time, a flow quantity of the PH$_3$ gas ranges from about 100 sccm to about 200 sccm.

Referring to FIG. 5C, the dielectric layer 28 and the plate 29 are formed on the above resultant structure.

The additional PH$_3$ doping process is not used in a fabrication process of the concave type capacitor shown in FIG. 4, but can be used in a process for fabricating a capacitor with a cylinder structure. Furthermore, this additional PH$_3$ doping process can be omitted if the first PH$_3$ doping process performed after the silicon grain 27 growth provides a good phosphorus doping profile.

When the first amorphous silicon layer 25 is deposited, an impurity doping concentration is split to observe a degree of prematurity of the silicon grains in order to check characteristics of the capacitor fabricated in accordance with the preferred embodiments of the present invention.

FIGS. 6A to 6E are micrographs of silicon grains prematurely grown depending on a doping concentration of phosphorus (P). The micrographs shown in FIGS. 6A to 6E depict the number of points of the premature silicon grain growth. For such observations, the phosphorus doping concentration of the first amorphous silicon layer is split into concentrations of about $3.2 \times 10^{21}/cm^3$, $2.8 \times 10^{21}/cm^3$, $1.3 \times 10^{21}/cm^3$, $7.0 \times 10^{20}/cm^3$ and $2.0 \times 10^{20}/cm^3$ when a first amorphous silicon layer doped with phosphorus and a second amorphous silicon layer not doped with phosphorus are deposited to a thickness of about 100 Å and about 400 Å, respectively.

Figure 6A:
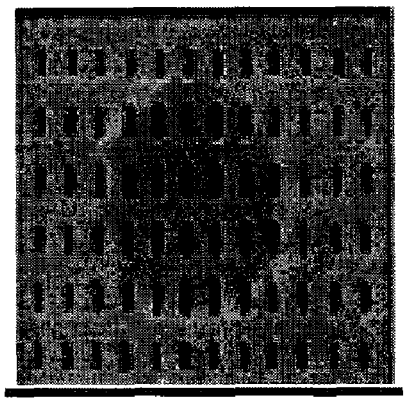
FIGS. 6A to 6E are micrographs of prematurely grown silicon grains depending on a doping concentration of phosphorus (P).
Figure 6B:
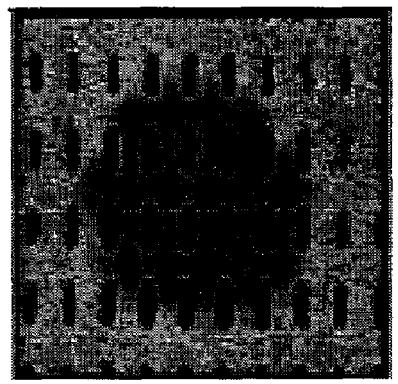
Figure 6C:
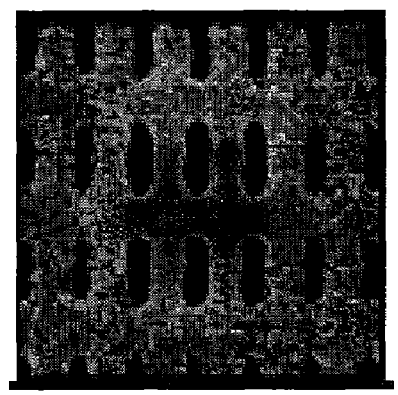
Figure 6D:
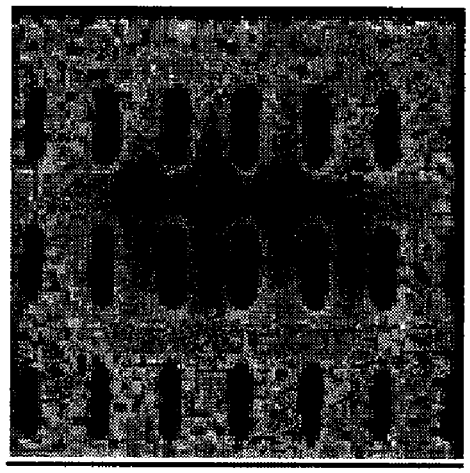
Figure 6E:
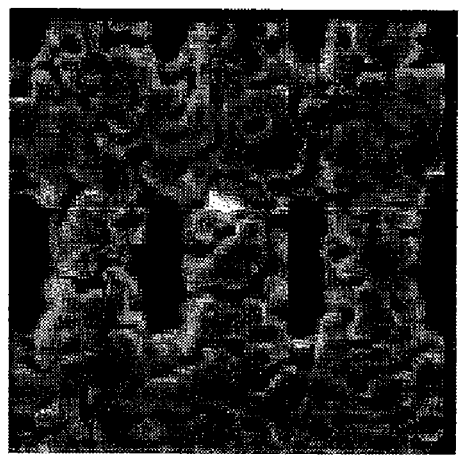

As shown in FIGS. 6A to 6E, there are 72 points of premature silicon grains in FIG. 6A, 106 points in FIG. 6B, 42 points in FIG. 6C, 71 points in FIG. 6D and 13 points in FIG. 6E. As the phosphorus doping concentration within the first amorphous silicon layer decreases, the number of points of the premature silicon grain growth decreases. If the phosphorus doping concentration is about $2.0 \times 10^{20}/cm^3$ as like the preferred embodiment of the present invention, the silicon grains are grown uniformly in almost all regions without the points of the premature silicon grain growth.

Table 1 shows recipes of the chamber plasma doping for the PH$_3$ doping process performed after the silicon grain growth. Table 2 depicts electric characteristics of a capacitor based on the recipes shown in Table 1. For each item in Table 1, the first amorphous silicon layer and the second amorphous silicon layer have the thickness of about 100 Å, and about 400 Å, respectively. A base temperature recipe for the metastable-polysilicon (MPS) growth, i.e., the silicon grain growth, for each item ranges from about 600° C. to about 650° C.

TABLE 1

| Item | Phosphorus concentration of the first amorphous silicon layer | Doping period | Flow quantity of PH$_3$ | Pressure | Temperature | Plasma power | MPS growth |
|---|---|---|---|---|---|---|---|
| Test 1 | $1.1 \times 10^{20}/cm^3$ | 70" | 300 sccm | 1 torr | 710/750° C. | 300 W | base |
| Test 2 | $1.1 \times 10^{20}/cm^3$ | 70" | 300 sccm | 1 torr | 710/750° C. | 300 W | base-10° C. |
| Test 3 | $1.1 \times 10^{20}/cm^3$ | 65" | 450 sccm | 2 torr | 710/750° C. | 450 W | base-10° C. |
| Test 4 | $1.1 \times 10^{20}/cm^3$ | 250" | 450 sccm | 2 torr | 710/750° C. | 450 W | base |
| Test 5 | $1.1 \times 10^{20}/cm^3$ | 250" | 450 sccm | 2 torr | 710/750° C. | 450 W | base-10° C. |
| Base | $32.0 \times 10^{20}/cm^3$ | 70" | 300 sccm | 1 torr | 710/750° C. | 300 W | base |

TABLE 2

| Recipe | Phosphorus concentration (after ONO cleaning) | ONO_BV(−) | ONO_CAP(−) | ONO_CAP(+) | SNC_LPC | SNC_LPCN | SNCN− |
|---|---|---|---|---|---|---|---|
| Test 1 | $5.50 \times 10^{20}/cm^3$ | −2.964 | 23.39 | 35.69 | 2348 | 30.86 | 49.24 |
| Test 2 | $5.50 \times 10^{20}/cm^3$ | −2.932 | 24.28 | 27.94 | 2348 | 20.54 | 32.44 |
| Test 3 | $6.60 \times 10^{20}/cm^3$ | −2.946 | 30.12 | 34.04 | 3602 | 20.44 | 34.78 |
| Test 4 | $2.10 \times 10^{21}/cm^3$ | −3.19 | 33.20 | 34.0 | 2352 | 20.66 | 33.34 |
| Test 5 | $2.10 \times 10^{21}/cm^3$ | −3.166 | 30.96 | 31.94 | 2048 | 17.52 | 31.9 |
| Base | $1.20 \times 10^{21}/cm^3$ | −3.399 | 32.64 | 31.78 | 2013 | 20.43 | 33.36 |

Referring to Table 2, the test 5 has similarity in capacitor characteristic as shown in the recipes ONO_BV, ONO_CAP (−) and ONO_CAP (+) and contact resistance characteristic as those of the conventional method proceeding under a base recipe, wherein the doping concentration of the first amorphous silicon layer is about $1.20 \times 10^{21}/cm^3$.

That is, the capacitor based on the recipe of the test 5 has a final phosphorus doping concentration of about $2.1 \times 10^{21}/cm^3$ after a pre-cleaning of the dielectric layer, and this phosphorus doping concentration is similar to the base phosphorus doping concentration of about $1.20 \times 10^{21}/cm^3$ obtained by employing the conventional method. Also, the capacitor characteristic and the contact resistance characteristic obtained by the recipe of the test 5 are similar to those found in the conventional method. Eventually, the recipe of the test 5 does not include a region where the silicon grain growth is suppressed.

Table 3 shows results of probe tests (PT) on a capacitor according to plasma doping recipes.

TABLE 3

| | PH3 doping recipe after MPS grain growth | | | | Doping concentration after ONO pre-cleaning | ONO_BV | CAP− | PT(%) |
|---|---|---|---|---|---|---|---|---|
| | Time | Pressure | flow quantity of PH3 | Plasma power | | | | |
| Conventional method | 70" | 1 torr | 300 sccm | 300 W | $12.6 \times 10^{21}/cm^3$ | −3.37 | 32.7 | 82.9 |
| Present invention | 250" | 2 torr | 450 sccm | 450 W | $9.0 \times 10^{21}/cm^3$ | −3.12 | 34.4 | 84.7 |
| | 65" | 2 torr | 450 sccm | 450 W | $15.1 \times 10^{21}/cm^3$ | −2.90 | 28.8 | 74.6 |

According to Table 3, the present invention can have a similar PT characteristic expressed in percentage, wherein the higher the percentage is, the lower the poor quality rate is. For instance, it is possible to obtain chips with better qualities. Also, the present invention shows the same electric capacitance (CAP−) and breakdown voltage (ONO-BV) to those of the conventional capacitor including a region without the MPS grain growth.

Table 4 shows electric characteristics of capacitors obtained by proceeding consecutively the plasma doping and the annealing at a temperature of about 700° C. for about 1 hour.

TABLE 4

| | CAP+ | CAP− | ONO_BV | SNC_LPCN | PT (%) |
|---|---|---|---|---|---|
| Base | 33.46 | 34.19 | −3.37 | 19.61 | 75.2 |
| Plasma doping + annealing | 35.62 | 31.46 | −3.12 | 22.98 | 75.3 |

As shown, electric characteristics of the capacitor fabricated according to the present invention are similar to those of the conventional capacitor. Particularly, it is observed that the probe tests on both of the above capacitors show that their electric characteristics are similar.

Based on the preferred embodiments of the present invention, it is possible to obtain uniform size of the silicon grains when the MPS grains are grown on the inner walls of the storage node with the concave or cylinder structure. As a result of the uniform size of the MPS grains, uniformity of the capacitance of the capacitor is also improved. Also, it is possible to obtain uniformity of the MPS grains without decreasing the thickness of the storage node.

While the present invention has been described with respect to certain preferred embodiments, it will be apparent to those skilled in the art that various changes and modifications may be made without departing from the scope of the invention as defined in the following claims.

What is claimed is:

1. A method for fabricating a capacitor of a semiconductor device, the method comprising:

forming an insulation layer having contact holes on an upper surface of a substrate;

forming a plurality of plugs connected to the substrate by being filled into the contact holes;

forming an isolation layer having holes exposing the plurality of the plugs on the insulation layer;

forming a first amorphous silicon layer doped with a first doping concentration over the isolation layer and the plurality of plugs, wherein the first doping concentration suppresses dopants from locally agglomerating;

forming a second amorphous silicon layer on the first amorphous silicon layer in an in-situ condition, wherein the second amorphous silicon layer is substantially undoped;

patterning the first amorphous silicon layer and the second amorphous silicon layer to form a storage node;

converting the second amorphous silicon layer to form a plurality of silicon grains on an inner wall of the fist amorphous silicon layer, wherein substantially all of the second amorphous silicon layer is converted to the silicon grains;

doping the storage node and the silicon grains with dopants until a second doping concentration is reached, wherein the second doping concentration provides conductivity to the storage node;

removing the isolation layer;

additionally doping the storage node and the silicon grains with dopants to compensate a doping profile of the storage node; and forming sequentially a dielectric layer and a plate over the storage node.

2. The method as recited in claim 1, wherein the step of additionally doping the storage node and the silicon grains comprises performing a chamber plasma doping method in an atmosphere containing phosphorus.

3. The method as recited in claim 2, wherein the chamber plasma doping is performed at a temperature ranging from about 700° C. to about 800° C. and a pressure ranging from about 1.5 torr to about 2.5 torr for about 2 minutes to about 5 minutes by supplying a plasma power ranging from about 300

W to about 500 w and PH$_3$ gas with a flow quantity ranging from about 300 sccm to about 500 sccm.

4. The method as recited in claim 1, wherein the first doping concentration ranges from about 1×10$^{19}$/cm$^3$ to about 9×10$^{19}$/cm$^3$ and the second doping concentration ranges from about 24×10$^{20}$/cm$^3$ to about 1×10$^{22}$/cm$^3$.

5. The method as recited in claim 1, wherein the first doping concentration ranges from about 1×10$^{19}$/cm$^3$ to about 9×10$^{19}$/cm$^3$ and the second doping concentration ranges from about 24×10$^{20}$/cm$^3$ to about 1×10$^{22}$/cm$^3$, wherein the step of doping the storage node and the silicon grains comprises performing a chamber plasma doping method in an atmosphere containing phosphorus.

6. The method as recited in claim 5, wherein the chamber plasma doping is performed at a temperature ranging from about 700° C. to about 800° C. and a pressure ranging from about 1.5 torr to about 2.5 torr for about 2 minutes to about 5 minutes by supplying a plasma power in a range from about 300 W to about 500 W and PH$_3$ gas with a flow quantity ranging from about 300 sccm to about 500 sccm.

* * * * *